United States Patent
Mangrum et al.

(10) Patent No.: US 7,476,563 B2
(45) Date of Patent: Jan. 13, 2009

(54) METHOD OF PACKAGING A DEVICE USING A DIELECTRIC LAYER

(75) Inventors: Marc A. Mangrum, Manchaca, TX (US); Kenneth R. Burch, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 195 days.

(21) Appl. No.: 11/561,241

(22) Filed: Nov. 17, 2006

(65) Prior Publication Data

US 2008/0119013 A1    May 22, 2008

(51) Int. Cl.
    *H01L 21/44* (2006.01)
(52) U.S. Cl. ............... 438/106; 438/109; 438/110; 438/113; 438/118; 438/127; 257/E21.502
(58) Field of Classification Search ............ 438/110
    See application file for complete search history.

(56) References Cited

U.S. PATENT DOCUMENTS

| | | | |
|---|---|---|---|
| 4,088,546 A | 5/1978 | Wu et al. | |
| 5,250,843 A | 10/1993 | Eichelberger | |
| 5,497,033 A | 3/1996 | Fillion et al. | |
| 6,271,060 B1 | 8/2001 | Zandman et al. | |
| 6,316,287 B1 | 11/2001 | Zandman et al. | |
| 6,400,573 B1 | 6/2002 | Mowatt et al. | |
| 6,407,929 B1 | 6/2002 | Hale et al. | |
| 6,562,647 B2 | 5/2003 | Zandman et al. | |
| 6,586,836 B1 | 7/2003 | Ma et al. | |
| 6,628,526 B1 | 9/2003 | Oshima et al. | |
| 6,655,023 B1 | 12/2003 | Eldridge et al. | |
| 6,825,552 B2 | 11/2004 | Light et al. | |
| 6,838,776 B2 | 1/2005 | Leal et al. | |
| 6,876,061 B2 | 4/2005 | Zandman et al. | |
| 6,921,860 B2 | 7/2005 | Peterson et al. | |
| 6,921,975 B2 | 7/2005 | Leal et al. | |
| 7,015,075 B2 | 3/2006 | Fay et al. | |
| 2003/0077871 A1* | 4/2003 | Cheng et al. | 438/381 |
| 2004/0009683 A1 | 1/2004 | Hiraoka et al. | |
| 2005/0158912 A1 | 7/2005 | Moden et al. | |
| 2005/0194669 A1 | 9/2005 | Kim et al. | |
| 2005/0242425 A1 | 11/2005 | Leal et al. | |

OTHER PUBLICATIONS

Freescale Semiconductor, Inc., Redistributed Chip Package (RCP) Technology, 6 pages, 2005.
International Search Report and Written Opinion related to PCT/US2007/080523, dated May 15, 2008.
International Search Report and Written Opinion related to PCT/US2007/080523, dated May 15, 2008.

* cited by examiner

*Primary Examiner*—N. Drew Richards
*Assistant Examiner*—Kyoung Lee
(74) *Attorney, Agent, or Firm*—Kim-Marie Vo; Jim Clingan

(57) ABSTRACT

A method is for packaging a first device having a first major surface and a second major surface. An encapsulant is formed over a second major surface of the first device and around sides of the first device. This leaves the first major surface of the first device exposed. A first dielectric layer is formed over the first major surface of the first device. a side contact interface is formed having at least a portion over the first dielectric layer. The encapsulant is cut to form a plurality of sides of encapsulant. A portion of the encapsulant is removed along a first side of the plurality of sides to expose a portion of the side contact interface along the first side of the plurality of sides.

20 Claims, 5 Drawing Sheets

METHOD OF PACKAGING A DEVICE USING A DIELECTRIC LAYER

CROSS-REFERENCE TO RELATED APPLICATION(S)

This application is related to the following four applications assigned to the assignee hereof, by the same inventors hereof, and filed on even date herewith:

1. U.S. patent application Ser. No. 11/561,234, titled METHOD OF PACKAGING A DEVICE HAVING A MULTI-CONTACT ELASTOMER CONNECTOR CONTACT AREA AND DEVICE THEREOF;

2. U.S. patent application Ser. No. 11/561,232, titled METHOD OF PACKAGING A DEVICE HAVING A TANGIBLE ELEMENT AND DEVICE THEREOF;

3. U.S. patent application Ser. No. 11/561,211, titled METHOD OF PACKAGING A DEVICE HAVING A KEYPAD SWITCH POINT; and 4. U.S. patent application Ser. No. 11/561,063, titled METHOD OF PACKAGING A SEMICONDUCTOR DEVICE AND A PREFABRICATED CONNECTOR.

FIELD OF THE INVENTION

This invention relates generally to packaging a device, and more specifically, to packaging a device using a dielectric layer.

BACKGROUND

Typically, devices are packaged for protection during operation. These packaged devices are placed on a printed circuit board (PCB) with other devices. The PCB with the devices is used in products, such as computers or cellular phones. Since there is a desire to decrease the size of products, such as computers and cellular phones, there is a need to decrease the size of the PCB and the package device without sacrificing functionality. In many cases, additional functionality is desired. For example, it may be desirable to have more than one device in a package. In addition, cost is a concern. Therefore, a need exists for a cost-effective packaging method that can increase functionality.

BRIEF DESCRIPTION OF THE DRAWINGS

The present invention is illustrated by way of example and is not limited by the accompanying figures, in which like references indicate similar elements. Skilled artisans appreciate that elements in the figures are illustrated for simplicity and clarity and have not necessarily been drawn to scale.

DETAILED DESCRIPTION OF THE DRAWINGS

A side contact interface is formed in a package. The side contact interface may include a conductive element that is exposed on the side or a minor surface. The conductive element may be capable of being aligned with other connectors, such as sockets or similar interface components. The side contact interface may include a resistor or capacitor, for example, to enhance the performance of the package. For example, the capacitor or resistor may be used to improve electrostatic discharge (ESD) performance or modify impedance. In some embodiments, the conductive element is a conductive portion of a resistor, capacitor, and an end of an interconnect, a conductive slug, the like, or combinations of the above.

Figure 1:
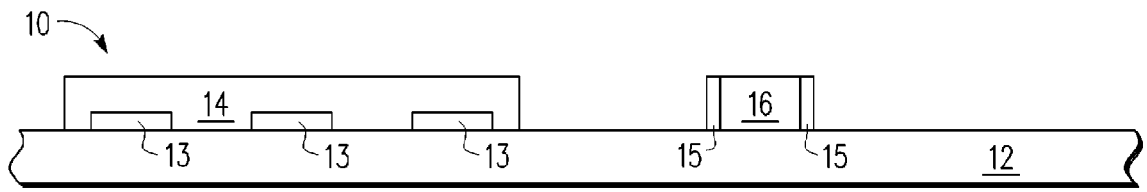
FIG. 1 illustrates a cross-section of an aggregated site including a portion of an adhesive, a first device, and a second device in accordance with an embodiment of the invention.

FIG. 1 illustrates a cross section of an aggregated site 10 including a portion of an adhesive 12, a die 14, and a resistor 16 in accordance with an embodiment of the invention. The die 14 includes contacts (e.g., pads) 13, which are exposed on one side (i.e., the front side) of the die 14. The resistor 16 includes contacts 15, which extend from one side of the resistor 16 to another. The adhesive 12, in one embodiment is a tape. The aggregated site 10 is a portion of a panel, which in one embodiment includes a plurality of identical aggregated sites 10 and in another embodiment includes plurality of aggregated sites 10 that are not all identical to each other. The panel is formed by placing die that have passed testing requirements, such as electrical, mechanical, or both, (i.e., known good die), discrete devices, the like, or combinations of the above on an adhesive 12. For example, die may be placed in an array to form a panel. Any arrangement of the die may be used. For example, the die may be arranged in a grid to form a circular shape, much like the arrangement of die on a wafer. The panel is essentially reconstructed with known good die. As will be understood with further explanation, the aggregated site 10 will become a (single) package. Thus, in the embodiment illustrated in FIG. 1 the package will include the die 14 and the resistor 16.

Figure 2:
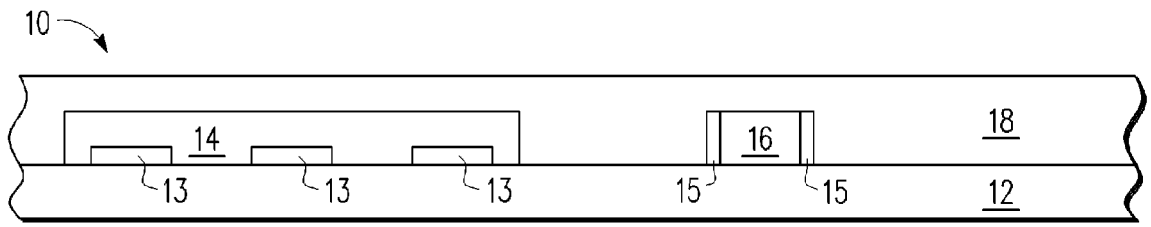
FIG. 2 illustrates the aggregated site of FIG. 1 after forming an encapsulant over the die and the second device in accordance with one embodiment.

FIG. 2 illustrates the aggregated site 10 after forming an encapsulant 18 over the die 14 and the resistor 16 in accordance with one embodiment. Any commercially available encapsulant can be used. For example, the encapsulant can be epoxy-based and heat curable. In one embodiment, the encapsulant is approximately 300 to approximately 500 microns thick. Because the adhesive 12 is in contact with one side of the die 14 and one side of the resistor 16, the encapsulant 18 is formed on the (five) sides of the die 14 and the resistor 16 that are not in contact with the adhesive 12. In the embodiment shown, the five sides of the die 14 that are in contact with the encapsulant 18 include all sides of the die 14 except the side that has the pads 13 exposed. Hence, the encapsulant 18 is formed over and adjacent the sides of the die 14 and the resistor 16. Thus, the encapsulant 18 is formed between the die 14 and the resistor 16.

Figure 3:
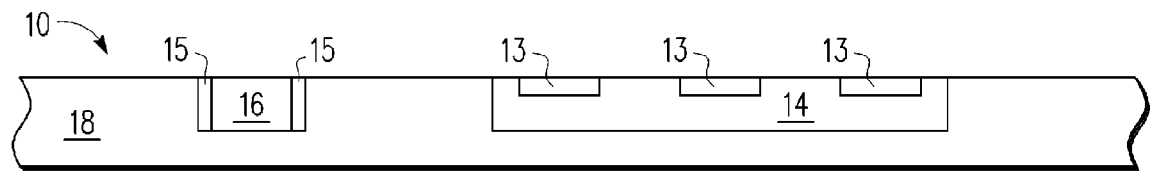
FIG. 3 illustrates the aggregated site of FIG. 2 after removing the adhesive in accordance with one embodiment.

FIG. 3 illustrates the aggregated site 10 after removing the adhesive 12 in accordance with one embodiment. Once the encapsulant 18 is formed, the die 14 and the resistors 16 are physically coupled together through the encapsulant 18 and thus, the adhesive 12 is no longer needed. The adhesive 12 can be removed using any process, such as heat (e.g., UV (ultraviolet) light and IR (infrared) light), a solvent, the like or combinations of the above. After the adhesive 12 is removed, the aggregated site 10 is flipped over so that the pads 13 of the die 14 are on top and exposed. After flipping over the aggregated site 10 the resistor 16 in the figures is now on the opposite side of the die 14 to show the same side of the resistor 16 and die 14 that was previously illustrated.

Figure 4:
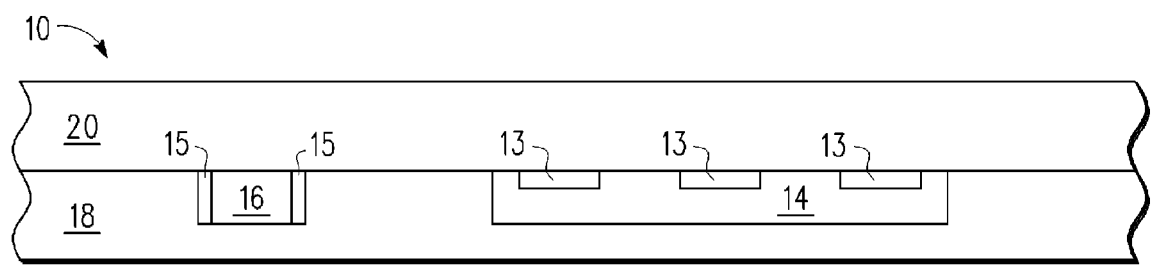
FIG. 4 illustrates the aggregated site of FIG. 3 after forming a first dielectric layer in accordance with one embodiment.

FIG. 4 illustrates the aggregated site 10 after forming a first dielectric layer 20 over the die 14 and the resistors 16 in accordance with one embodiment. The first dielectric layer 20 may be a conventional spun-on polymer or any other suitable material formed by any suitable process. In one embodiment, the first dielectric layer 10 may be approximately 20 microns thick of a spun-on polymer.

Figure 5:
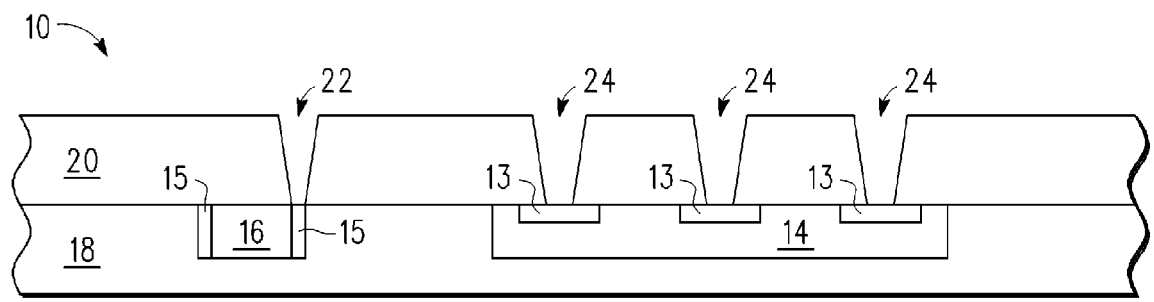
FIG. 5 illustrates the aggregated site of FIG. 4 after forming a via-holes in accordance with one embodiment.

FIG. 5 illustrates the aggregated site 10 after forming a resistor via-hole 22 and die via-holes 24 in accordance with one embodiment. The resistor and die via-holes 22 and 24 are formed by patterning and etching the first dielectric layer 20 to expose at least a portion of one of the contacts 15 and at least a portion of each of the pads 13. In the embodiment illustrated, the resistor via-hole 22 is formed over the contact 15 that is closest to the die 14 (i.e., the inner contact 15). As will be better understood after further discussion, a resistor via-hole is not formed in the embodiment illustrated to the other contact 15 (i.e., the outer contact 15) because this contact 15 will be exposed during later processing to form a connector to couple the resistor to an external device.

Figure 6:
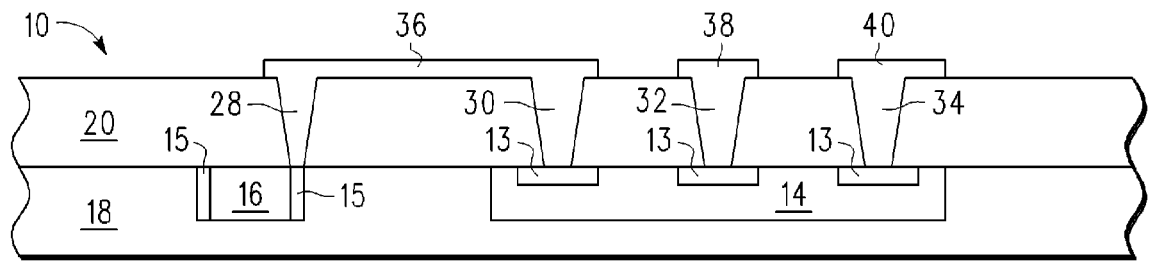
FIG. 6 illustrates the aggregated site of FIG. 5 after forming vias and interconnects in accordance with one embodiment.

FIG. 6 illustrates the aggregated site 10 after forming via 28 to contact 15 of the resistor 16 and die vias 30, 32, and 34 to the die 14 and interconnects 36, 38, and 40 in accordance with one embodiment. (The vias are conductors formed within the via-holes.) The material used to fill the resistor and die vias 28, 30, 32, and 34 and form the interconnects 36, 38, and 40 can be any conductive material, such as copper. The material can be deposited using any suitable process (e.g., chemical vapor deposition (CVD), atomic layer deposition (ALD), plating, the like, and combinations of the above) to fill the via-holes 22 and 24 and form a thick enough material over the first dielectric layer 20. The material that lies outside the resistor and die vias 28, 30, 32, and 34 and over the first dielectric layer 20 may be patterned to form the interconnects 36, 38, and 40. The interconnect 36 couples the resistor 16 to the die 14 through the resistor via 28 and the die via 30. The interconnect 38 travels in a direction that is in and out of the page and may couple the die 14 to other devices that are not illustrated. The interconnect 40 travels to the right of the die 14 and in a direction that is in and out of the page and may couple the die 14 to other devices that are not illustrated. The length of the interconnects 28 and 40 need not be the same. A skilled artisan recognizes that the interconnects 36, 38, and 40 illustrated in FIG. 6 are merely examples of the interconnects that can be formed.

Figure 7:
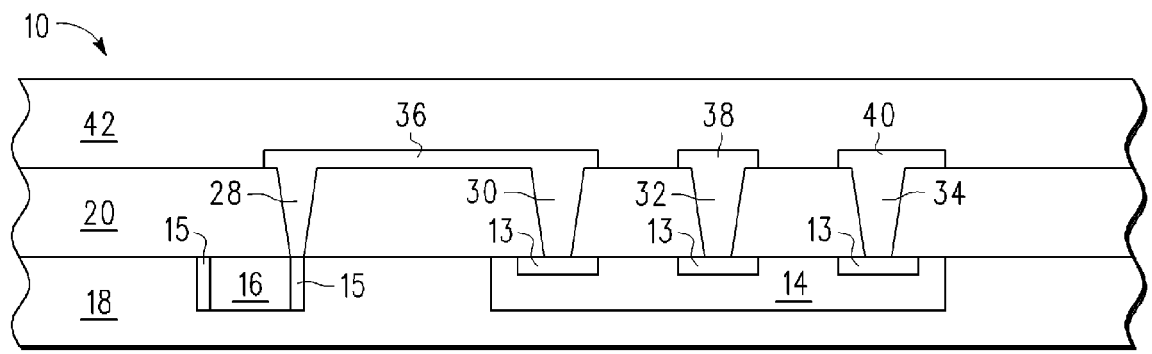
FIG. 7 illustrates the aggregate site of FIG. 6 after forming the second dielectric layer in accordance with one embodiment.

FIG. 7 illustrates the aggregate site 10 after forming the second dielectric layer 42. The second dielectric layer 42 may be a spun-on polymer or another suitable material. The second dielectric layer 42 may be the same material or a different material than the first dielectric layer 20 and may or may not be formed by the same process as the first dielectric layer 20. The second dielectric layer 42 is formed over the interconnects 36, 38, and 40. In one embodiment, the second dielectric layer 42 is approximately 20 microns thick.

Figure 8:
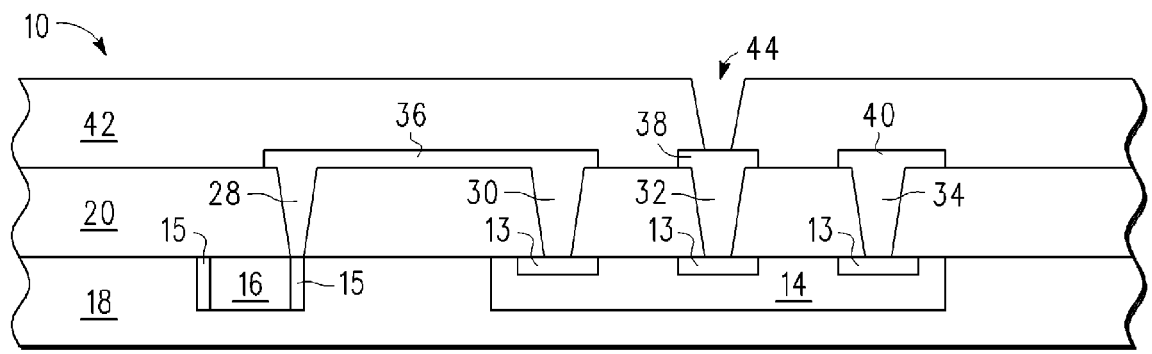
FIG. 8 illustrates the aggregate site of FIG. 7 after forming a via-hole in the second dielectric layer in accordance with one embodiment.

FIG. 8 illustrates the aggregate site 10 after forming a via-hole 44 in the second dielectric layer 42 in accordance with one embodiment. The via-hole 44 may be formed by patterning and etching the second dielectric layer 42. The via-hole 44, in the embodiment illustrated, exposes at least a portion of the interconnect 38. A skilled artisan understands that the via-hole 44 can be formed over another interconnect, such as the interconnect 40.

Figure 9:
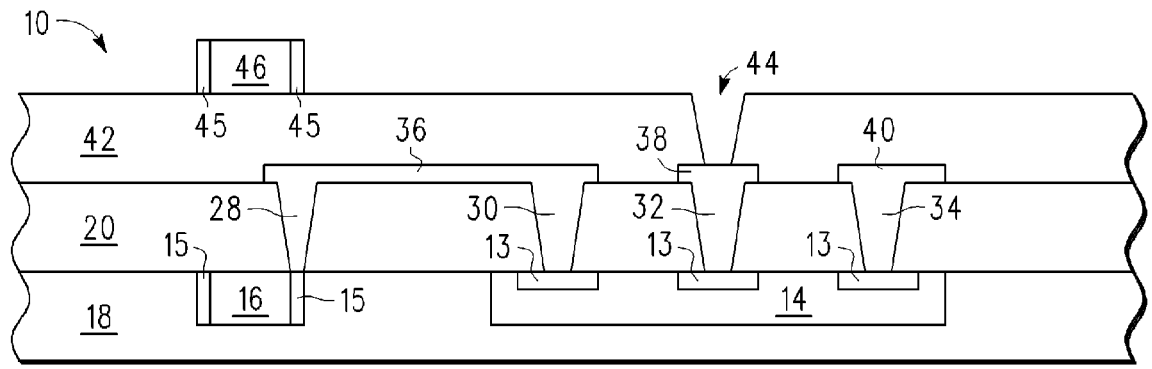
FIG. 9 illustrates the aggregate site of FIG. 8 after forming a third device over the second dielectric layer in accordance with one embodiment.

FIG. 9 illustrates the aggregate site 10 after forming a resistor 46 over the second dielectric layer 42 in accordance with on embodiment. The resistor 46 includes contacts 45, which are similar to the contacts 15 of the resistor 16. The resistor 46 may be placed using a pick-and-place tool over and approximately in-line with the resistor 16. In this embodiment, the ends of the contact 45 and the ends of the contacts 15 are approximately in line with each other. Conventional pick-and-place tools can place the resistor 46 within approximately 10 or less microns of a predetermined location and therefore the resistors 46 and 16 may be substantially in line with each other. However, the resistors 46 and 16 may not be in line with each other. Thus, the resistors 46 and 16 may be staggered relative to each other in any direction. The resistor 46 is preferably placed while the second dielectric layer 42 is not fully dried. Thus, the second dielectric layer 42 will be stick or tacky and the resistor 46 will adhere to the second dielectric layer 42 without any additional adhesive layers.

Figure 10:
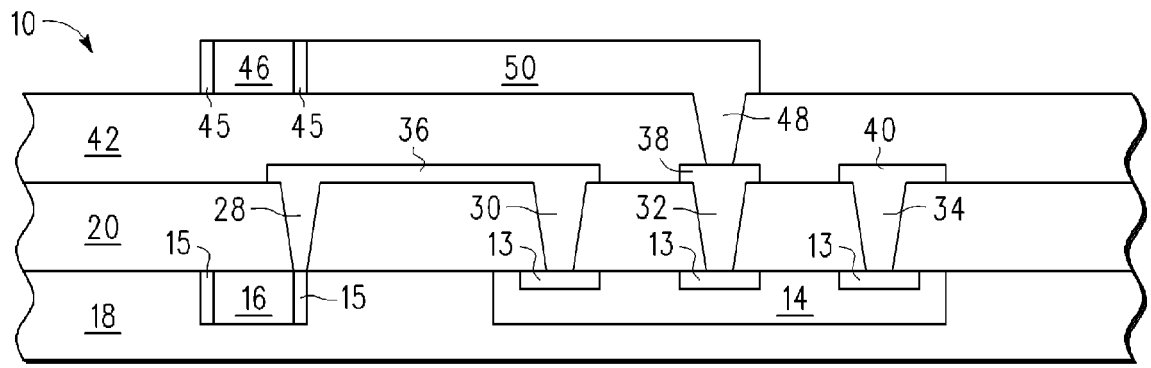
FIG. 10 illustrates the aggregate site of FIG. 9 after forming an interconnect in accordance with one embodiment.

FIG. 10 illustrates the aggregate site 10 after forming an interconnect 50 in accordance with one embodiment. The interconnect 50 may be any conductive material, such as copper. In one embodiment, to form the interconnect 50 a material is deposited (e.g., by CVD, ALD, plating, the like, or combinations of the above) and then patterned. The interconnect 50 couples the resistor 46 (i.e., its inner contact 45) to the die 14 through vias 48 and 32, contacts 14 and 45, and the interconnect 38. In one embodiment, the via 48 is formed by patterning the second dielectric layer 42, forming a conductive material over the aggregate site 10 and patterning the conductive material to form the via 48. The via 48, in one embodiment, is formed before placing the resistor 46 and in another embodiment, it is formed after placing the resistor 46. In one embodiment, a photoresist layer, such as a thick film type, may be formed over the aggregate site 10 covering the resistor 46 but exposing the contact 45 that will be coupled to the subsequently formed interconnect 50. The photoresist may define the trace routing for the aggregate site 10. Next, a conductive material, such as copper, is formed. Even if the resistor 46 is not covered by the photoresist layer the conductive material may not adhere to it if the resistor 46, for example, has a ceramic body. Next, the photoresist can be removed to form the interconnect 50.

Figure 11:
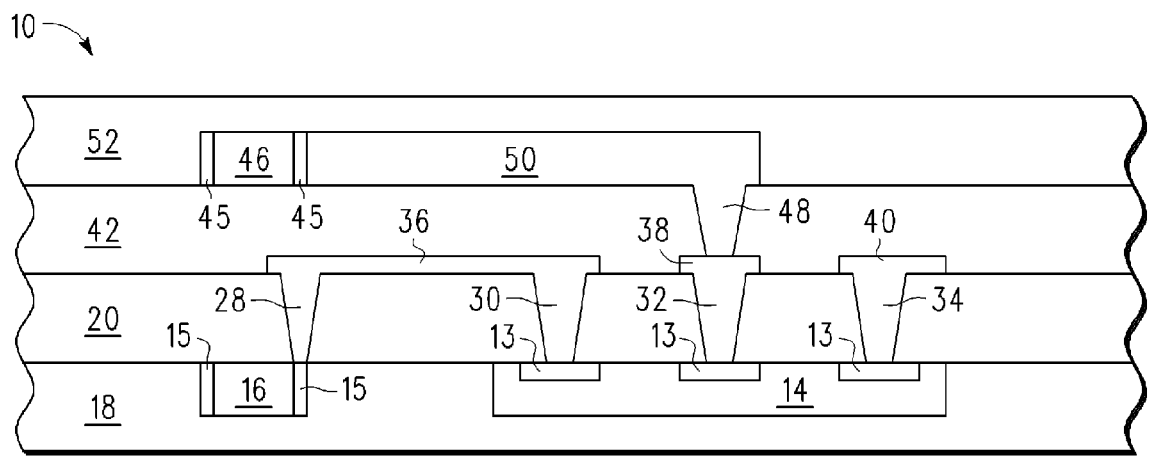
FIG. 11 illustrates the aggregate site of FIG. 10 after forming a layer in accordance with one embodiment.

FIG. 11 illustrates the aggregate site 10 after forming a layer 52 in accordance with one embodiment. The layer 52 may be formed by the same processes and be of the same materials as the second dielectric layer 42 or the first dielectric layer 20. In one embodiment, the third dielectric layer 20 is an encapsulant material.

Figure 12:
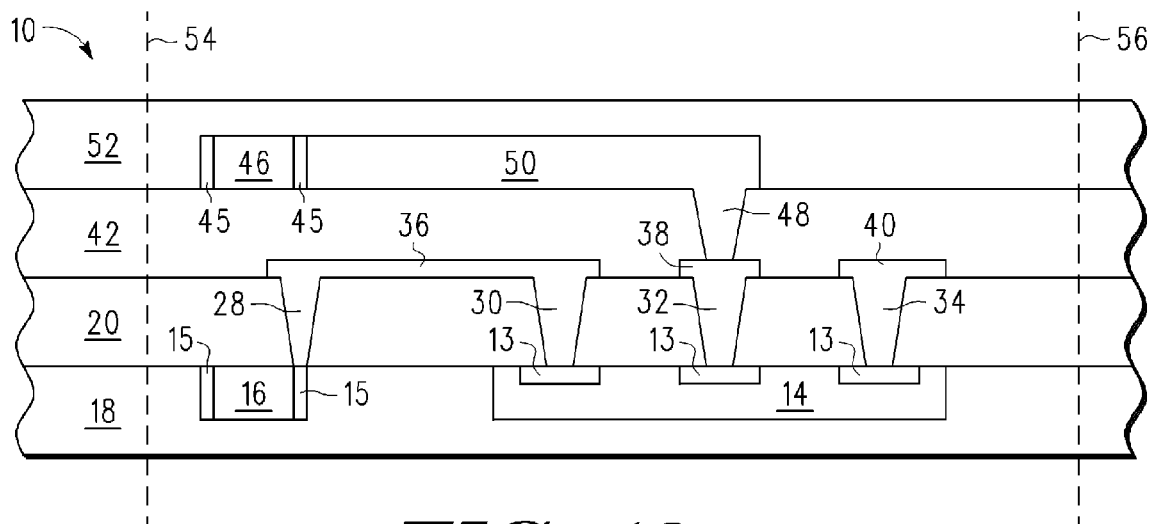
FIG. 12 illustrates the aggregate site of FIG. 11 with singulation lines in accordance with one embodiment

FIG. 12 illustrates the aggregate site 10 with singulation lines 54 and 56 in accordance with one embodiment. In the embodiment illustrated, the singulation line 54 singulates the aggregate site 10 near the resistors 16 and 46, but does not expose the resistors 16 and 46. In one embodiment, when the singulation line 54 singulates the aggregate site 10 near the resistors 16 and 46, the singulation line 54 singulates the aggregate site within 0.025 inches of the closest edge of the resistors 16 and 46. In one embodiment, when the singulation line 54 singulates the aggregate site 10 near the resistors 16 and 46, the singulation is within the accuracy limits of the singulation and placement processes. The singulation can occur by any process, such as with a saw, laser or other means. In the embodiment illustrated the singulation line 56 cuts the aggregate site 10 near the die 14, but does not expose the die 14. Thus, the encapsulant 18 (and the third dielectric layer 20 if it is an encapsulant) is cut to form a plurality of sides of the encapsulant 18 (and the third dielectric layer 20 if is an encapsulant).

Figure 13:
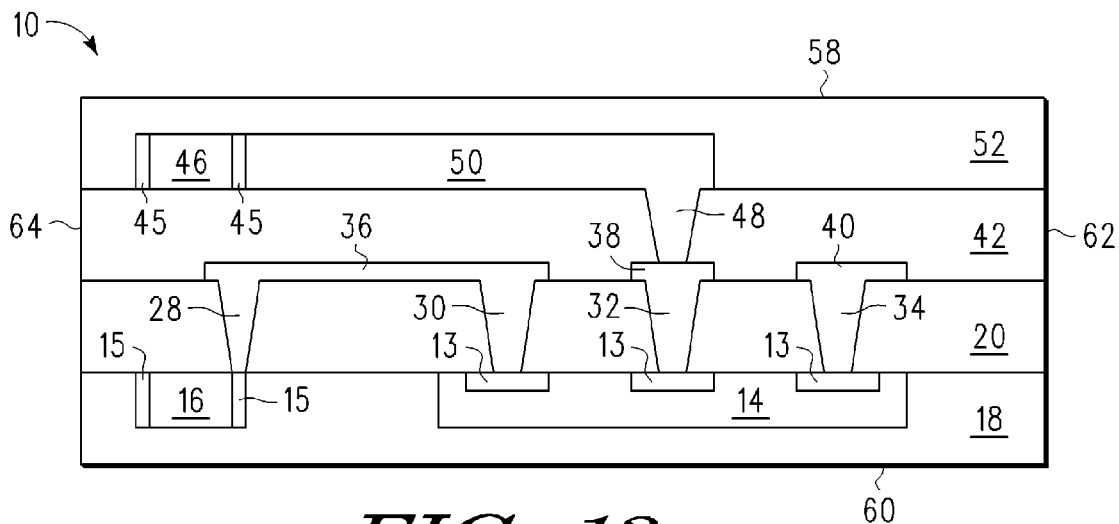
FIG. 13 illustrates the aggregate site of FIG. 12 after cutting along the singulation lines to form minor surfaces in accordance with one embodiment.

FIG. 13 illustrates the aggregate site 10 after cutting along the singulation lines 54 and 56 to form minor surfaces 64 and 62 in accordance with an embodiment. The aggregate site 10 has major surfaces 58 and 60 and minor surfaces 62 and 64. The major surfaces 58 and 60 are opposite each other and the minor surfaces 62 and 64 are opposite each other. In one embodiment, the major surface 58 is the top of the aggregate site 10 and the major surface 60 is the bottom of the aggregate site 10. The minor surfaces 62 and 64 are the edges of the aggregate site 10.

Figure 14:
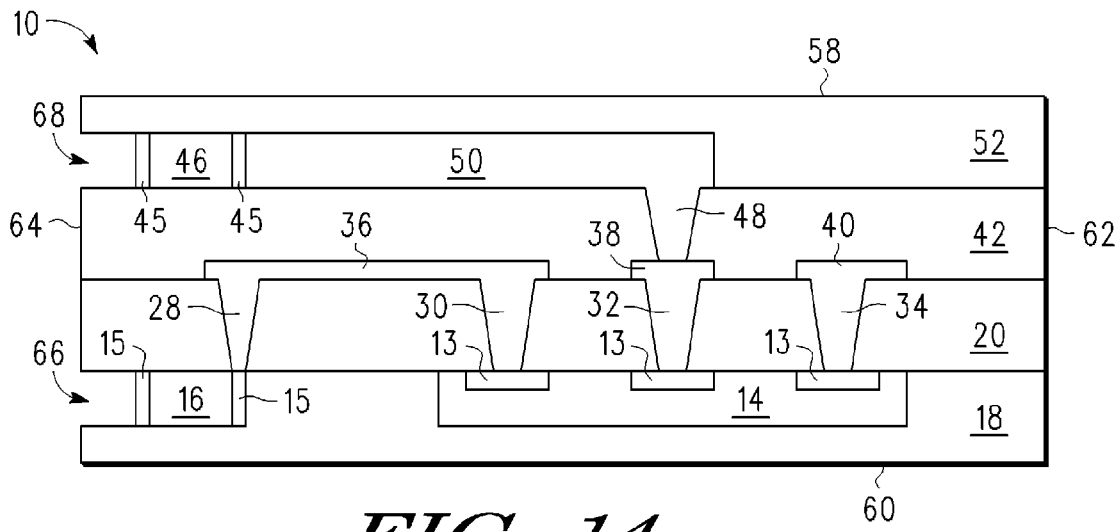
FIG. 14 illustrates the aggregate site of FIG. 13 after removing a portion of the encapsulant and the layer along one of the plurality of sides that were formed when cutting to expose a portion of a side contact interface in accordance with one embodiment.

FIG. 14 illustrates the aggregate site 10 after removing a portion of the encapsulant 18 and the layer 52 along one of the plurality of sides that were formed when cutting to expose a portion of a side contact interface in accordance with one embodiment. The removal can occur by various processes, such as with a laser or by etching away portions of the encapsulant 18 and the dielectric layer 52. In the embodiment illustrated, there are two side contact interfaces. The first side contact interface includes the interconnect 36, the resistor via 28, and the resistor 16. The first side contact interface is exposed along a minor surface 64 of the aggregate site 10, which is now a package, and coupled to the die 14, which is surrounded on five sides by encapsulant, through the die via 30. The second side contact interface includes the interconnect 38, the via 48, the interconnect 50, and the resistor 46. The second side contact interface is coupled to the die 14 through the die via 32. In the embodiment illustrated, the side contact interfaces are exposed along a minor surface 64 and are coupled to a device, such as the die 14, through a via; any additional vias or interconnects that are used for the coupling are part of the side contact interface.

Figure 15:
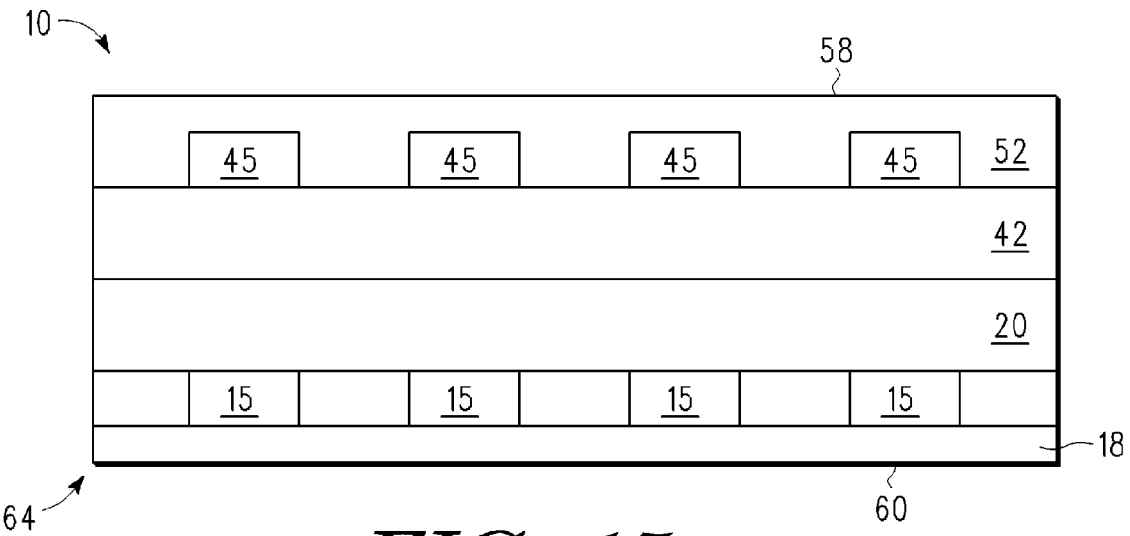
FIG. 15 illustrates the minor surface of the aggregate site of FIG. 14 after exposing side contact interfaces in accordance with one embodiment.

FIG. 15 illustrates the minor surface 64 of the aggregate site 10 after exposing side contact interfaces. In the embodiment illustrated, there are multiple resistors 46 and 16 in the aggregate site 10 (or package). Thus, there are multiple contacts 15 and 45. The multiple contacts 15 and 45 together form a connector (or multiple connectors) that can be used to couple the package 10 to another device. For example, the package 10 can be coupled via the connector to a cell phone, a computer, or another device.

Figure 16:
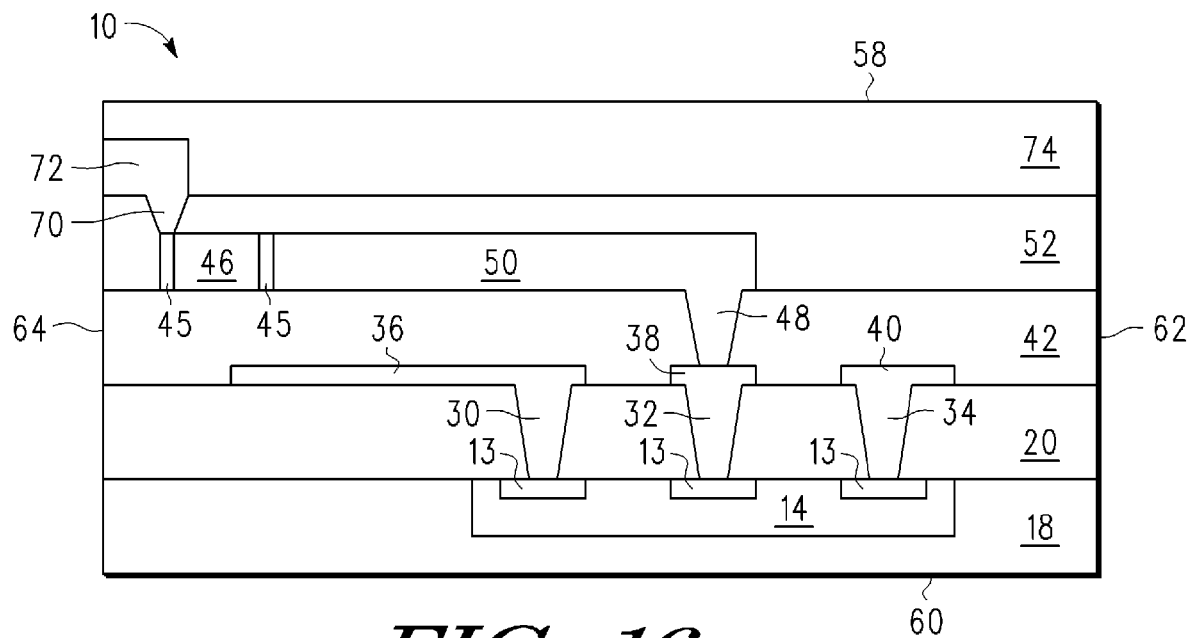
FIG. 16 illustrates an aggregate site with another side contact interface in accordance with one embodiment.

FIG. 16 illustrates the aggregate site 10, which is a package at this stage, with an external interconnect 72 in accordance with another embodiment. The aggregate site 10 does not include the resistor 16. Hence, the interconnect 36 is not coupled to the resistor 16 and instead, may be coupled to another device (not shown) in the aggregate site 10. Alternatively, the interconnect 36 may not be present. The aggregate site 10 includes an external interconnect 72 that is coupled to the resistor 46. In the embodiment illustrated, the external interconnect 72 is coupled to the contact 45 that is closest to the edge of the aggregate site 10 (i.e., the outer contact 45) through a resistor via 70. The resistor via 70 and the external interconnect 72 can be formed by patterning the layer 52 to form a resistor via-hole and then filling the via-hole with a conductive material, such as copper. The conductive material is formed over the layer 52. The conductive material that is over the layer 52 may then be patterned to form the external interconnect 72. After forming the external interconnect 72, a layer 74, which can be any dielectric layer or an encapsulant, is formed. In the embodiment illustrated, the side contact interface includes the interconnect 50, the resistor 46 (with its contacts 45), the via 70, and the external interconnect 72. After forming the layer 74, the aggregate site 10 is cut as in FIG. 12. As shown in FIG. 16, the aggregate site 10 can be cut to expose the external interconnect 72. In one embodiment, a portion of the external interconnect 72 is removed during the cutting process. It is preferable, that the cutting does not remove a portion of the resistor 46. Hence, the resistor 46 and the external interconnect 72 may be staggered, as shown in FIG. 16. After cutting the aggregate site 10 to form the package, portions of a dielectric or encapsulant may not be removed. In other words, the resistor 46 may not be exposed. The major portion 58 is now over the layer 74, not the layer 52.

Figure 17:
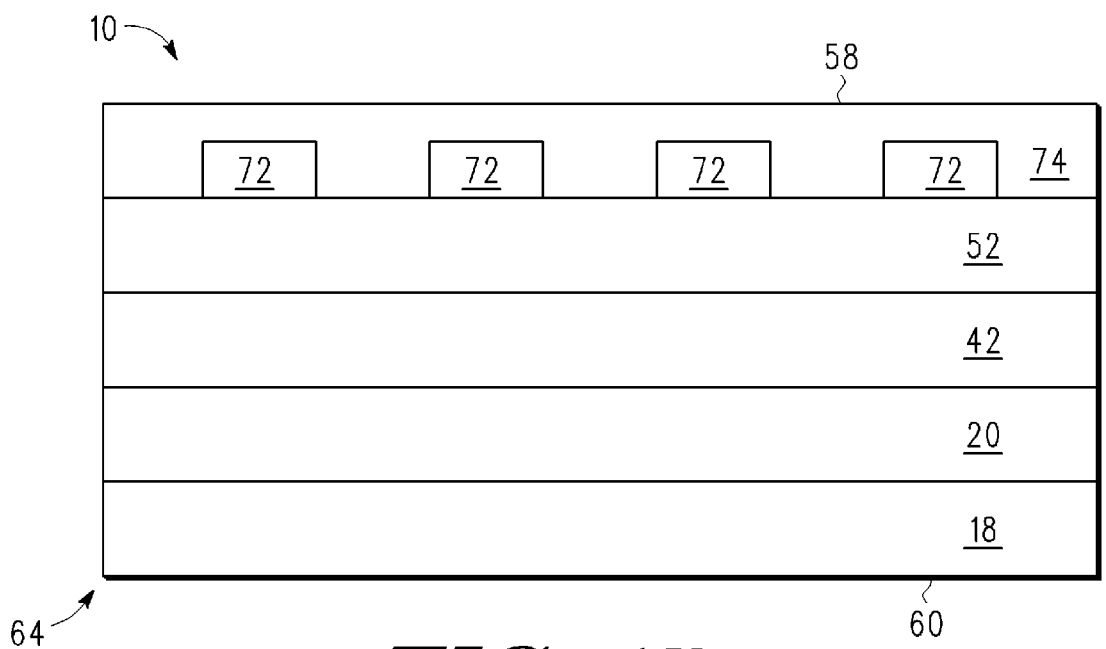
FIG. 17 illustrates the minor surface of the aggregate site of FIG. 16 in accordance with one embodiment.

FIG. 17 illustrates the minor surface 64 of the aggregate site 10 after exposing the external interconnect 72 in accordance with one embodiment. In this embodiment, the resistor 46 is not exposed. (But, in another embodiment, the resistor(s) 46 are exposed along with the external interconnect 72.) The plurality of external interconnect 72 are used as the connector interface. The resistor(s) 46 are not part of the connector interface because they are not exposed. However, the resistor(s) 46 are part of the connector interface in the embodiment illustrated, because the resistor(s) 46 are coupled to the external interconnect. In one embodiment, the resistor(s) 46 are not present and hence, the external interconnect is coupled to the interconnect 50 without a resistor.

Various modifications to the embodiments above are possible. For example, the resistors 16 and 46 can be other elements such as capacitors, inductors, conductive slugs, the like, or combinations of the above. In addition, the exposed portion of the side contact interface that is used as a connector or part of a connector can be a portion (e.g., an end portion) of an interconnect. Although FIGS. 9-15 illustrate two resistors (resistors 16 and 46) any number of resistors may be used. For example, only one resistor may be present. Although in FIGS. 9-15, the resistor 16 is in the same horizontal plane or layer as the die 14, the resistor 16 can be in a different layer than the die 14. For example, the resistor 16 can be in a layer above the die 14 or the die 14 can be in a layer above the resistor 16. Similarly, although in FIGS. 9-15, the resistors 16 and 46 are in different layers, they can be in the same layer as each other. In FIG. 12, the singulation line 54 is chosen so that the resistors 16 and 46 are not exposed after the cutting process. However, the singulation line 54 can be chosen so that the resistors 16 and 46 are exposed after the cutting process. In one embodiment, portions of the contacts 15 and 45 may be removed during the cutting process. In FIG. 14, portions of the encapsulant 18 and the layer 52 are removed. In another embodiment, portions of the dielectric layers 20 and 42 and additional portions of the encapsulant 18 and the layers 52 are removed. This can occur using a lapping or grinding process to expose the contacts 15 and 45 of the resistors 16 and 46. Although not illustrated, solder balls or other external connections, may be formed on the major surfaces 58 and 60 or minor surfaces 62 and 64 of the package. In one embodiment, solder balls are formed on the major surface 60 and the side contact interface is coupled to an antennae because the side contact interfaces is a shorter electrical path out of the package than the solder balls. In addition, any number of die, discrete devices (e.g., resistors, etc.), conductive plugs, the like, or combinations of the above can be formed in the package. The number of resistors and die illustrated in the figures are for illustration purposes only. Therefore, only one die may be formed in the package and have a side contact interface that may or may not include a discrete device, such as resistors. Furthermore, it should be understood that the side contact interface may be flush or recessed with respect to the minor surfaces 64 or 62. In addition, if there is more than one side contact interface each one can be flush or recessed any distance and they all need not be flush or recessed the same distance. Furthermore, although side contact interfaces are only shown exposed on the minor surface 62, side contact interface(s) may be exposed on the minor surface 64 alternatively or in addition to those exposed on the minor surface 62.

A skilled artisan recognizes that the side contact interfaces illustrated are only examples of various side contact interfaces. In general, a side contact interface is exposed on a minor surface of the package. The side contact interface may terminate with an interconnect, resistor, capacitor, inductor, slug, or the like. The side contact interface allows for electrical connections at the edge of the package. The side contact interface is coupled to a device within the package and is capable of being coupled to an external device. For example, a user may plug an external device into the side contact interface.

By now it should be appreciated that there has been provided a low cost method for fabricating and embedding connectors or electrical interface within a package using a build-up technology for creating a package. The resulting package may be a redistributed chip package (RCP) because the interconnects are routed or redistributed among one or more layers to minimize the area of the package. No wirebonding or traditional substrate (leadframe or package substrate) is needed to form a RCP. This increases yield and decreases cost.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, advantages, solutions to problems, and any element(s) that may cause any benefit, advantage, or solution to occur or become more pronounced are not to be construed as a critical, required, or essential feature or element of any or all the claims. The terms "a" or "an", as used herein, are defined as one or more than one even if other elements are clearly stated as being one or more in the claims or specification. The term "plurality", as used herein, is defined as two or more than two. The term another, as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:

1. A method of packaging a first device having a first major surface and a second major surface, comprising:
    forming an encapsulant over a second major surface of the first device and around sides of the first device and leaving the first major surface of the first device exposed;
    forming a first dielectric layer over the first major surface of the first device;
    forming a side contact interface having at least a portion over the first dielectric layer;
    cutting the encapsulant to form a plurality of sides of the encapsulant; and
    removing a portion of the encapsulant along a first side of the plurality of sides to expose a portion of the side contact interface along the first side of the plurality of sides.

2. The method of claim 1, further comprising:
    applying tape to the first major surface prior to the step of forming the encapsulant; and
    removing the tape prior to the step of forming the first dielectric layer.

3. The method of claim 1, further comprising:
    forming a first via in the first dielectric layer to a first contact of the first device;
    wherein the step of forming the side contact interface is further characterized by the side contact interface comprising a first interconnect between the first via and the first side of the plurality of sides.

4. The method of claim 3, wherein the step of forming the side contact interface is further characterized by the side contact interface further comprising a second device between the interconnect and the first side of the plurality of sides.

5. The method of claim 4, wherein the step of forming the side contact interface is further characterized by:
    forming a second via through the first dielectric layer between a first contact of the second device and the first interconnect.

6. The method of claim 4, wherein the step of forming the side contact interface is further characterized by the second device being formed over the first dielectric layer.

7. The method of claim 4, wherein the step of forming the first dielectric layer is further characterized as being formed over the second device.

8. The method of claim 1, wherein the step of forming the side contact interface is further characterized by:
    forming a first via through the first dielectric layer between a first contact of a second device and a first interconnect between the via and the first side of the plurality of sides.

9. The method of claim 1, wherein the step of forming the encapsulant is further characterized by the encapsulant being epoxy-based and heat curable.

10. The method of claim 1, wherein the step of forming the first dielectric layer is further characterized by the first dielectric layer being a polymer dielectric.

11. A method, comprising:
applying tape to a first major surface of a first device;
forming an encapsulant that is over a second major surface of the first device and around sides of the first device for providing physical support for handling the first device;
removing the tape from the first major surface after forming the encapsulant;
depositing a first dielectric layer that is a polymer dielectric over the first major surface of the first device;
forming a side contact interface having at least a portion over the first dielectric layer;
cutting the encapsulant to form a plurality of sides of the encapsulant; and
removing a portion of the encapsulant along a first side of the plurality of sides to expose a portion of the side contact interface along the first side of the plurality of sides.

12. The method of claim 11, wherein the step of applying tape is further characterized by the first device having a contact, further comprising:
etching a via-hole through the first dielectric layer; and
forming a conductor in the via-hole, wherein the via contacts the side contact interface and the first contact of the first device.

13. The method of claim 11, wherein the step of forming a side contact interface is further characterized by the side contact interface comprising a second device connected between the via and the first side of the plurality of sides.

14. The method of claim 13, wherein the step of removing a portion of the encapsulant is further characterized by exposing a contact of the second device.

15. The method of claim 11, wherein:
the step of forming a side contact interface is further characterized by the side contact interface comprising an interconnect layer extending to the first side; and
the step of removing a portion of the encapsulant is further characterized by exposing an end portion of the interconnect layer.

16. The method of claim 11, further comprising forming a second dielectric layer over the side contact interface.

17. The method, of claim 11, wherein the step of applying tape to the first major surface of a first device is further characterized by the first device being a semiconductor die.

18. A method, comprising:
applying a tape having adhesive properties to a first major surface of a first device and a first major surface of a second device, wherein the first device has a first contact along the first major surface and the second device has a first contact and a second contact;
forming an encapsulant over a second major surface of the first device and second major surface of the second device and along sides of the first and second devices wherein the encapsulant has a first major surface over the second major surfaces of the first and second devices and a second major surface opposite the first major surface;
removing the tape;
forming a first dielectric layer over the first major surface of the first device and the first major surface of the second device;
forming a first via-hole and a second via-hole in the first dielectric layer;
forming a first conductor from the first contact of the first device to the first contact of the second device through the first and second via-holes;
cutting the encapsulant to form a plurality of sides of encapsulant between the first and second major surfaces of the encapsulant; and
removing a portion of the encapsulant along a first side of the plurality of sides to expose the second contact of the second device along the first side of the plurality of sides.

19. The method of claim 18, wherein the first device is a semiconductor die and the second device comprises a resistor.

20. The method of claim 18, wherein the first device has a second contact, further comprising:
forming a third device over the first dielectric layer, wherein the third device has a first contact and a second contact;
forming a second dielectric layer over the first dielectric layer and the third device;
forming a third via through the first dielectric layer;
forming a fourth via through the second dielectric layer; and
forming a second conductor from the second contact of the first device to the first contact of the third device through the third and fourth vias;
wherein the step of removing a portion of the encapsulant is further characterized as exposing second contact of the third device along the first side of the encapsulant.

* * * * *